US008213992B2

(12) United States Patent
Koizumi et al.

(10) Patent No.: US 8,213,992 B2
(45) Date of Patent: Jul. 3, 2012

(54) RADIO BASE STATION APPARATUS

(75) Inventors: Daisuke Koizumi, Zushi (JP); Masayuki Motegi, Yokohama (JP); Yoshitsugu Shimazu, Kawasaki (JP); Seizo Onoe, Yokohama (JP); Naoki Nakaminami, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 177 days.

(21) Appl. No.: 12/670,339

(22) PCT Filed: Jul. 23, 2008

(86) PCT No.: PCT/JP2008/063203
§ 371 (c)(1),
(2), (4) Date: May 26, 2010

(87) PCT Pub. No.: WO2009/014145
PCT Pub. Date: Jan. 29, 2009

(65) Prior Publication Data
US 2010/0304790 A1    Dec. 2, 2010

(30) Foreign Application Priority Data
Jul. 24, 2007    (JP) .................................. 2007-192696

(51) Int. Cl.
H04M 1/00    (2006.01)
(52) U.S. Cl. .................. 455/561; 455/127.1; 455/127.2; 455/127.3
(58) Field of Classification Search .................. 455/561, 455/127.1, 127.2, 127.3
See application file for complete search history.

(56) References Cited

U.S. PATENT DOCUMENTS
2008/0227413 A1* 9/2008 Lindskog ...................... 455/101
2009/0088102 A1* 4/2009 Gan et al. ................... 455/127.2

FOREIGN PATENT DOCUMENTS
| JP | 2000-269879 A | 9/2000 |
| JP | 2000-278227 A | 10/2000 |
| JP | 2003-115793 A | 4/2003 |
| WO | 2006/071005 A1 | 7/2006 |

OTHER PUBLICATIONS
International Search Report issued in PCT/JP2008/063203, mailed on Sep. 9, 2008, with translation, 3 pages.
Written Opinion issued in PCT/JP2008/063203, mailed on Sep. 9, 2008, 3 pages.

* cited by examiner

Primary Examiner — Barry Taylor
(74) Attorney, Agent, or Firm — Osha Liang LLP

(57) ABSTRACT

A shared AMP includes: a transmission/reception processor section (TRX-B) for a second mobile communication system configured to perform frequency conversion processing on an inputted transmission baseband signal for a mobile communication system B, and to output a transmission radio frequency signal for the second mobile communication system; a power level adjuster section (VA) configured to adjust a power level of an inputted transmission radio frequency signal for a first mobile communication system; a combiner section (COM) configured to generate a transmission radio frequency signal, by combining the transmission radio frequency signal for the first mobile communication system outputted from the power level adjuster section (VA) and the transmission radio frequency signal for the second mobile communication system outputted from the transmission/reception processor section (TRX-B) for the second mobile communication system; and a common amplifier section (PA) configured to amplify a power level of the transmission radio frequency signal outputted from the combiner section (COM) at a predetermined amplification rate, and to output the resultant signal.

25 Claims, 10 Drawing Sheets

Prior Art

Prior Art

RADIO BASE STATION APPARATUS

TECHNICAL FIELD

The present invention relates to a radio base station apparatus including a shared amplification function configured to amplify both transmission signals for a first mobile communication system and transmission signals for a second mobile communication system.

BACKGROUND ART

FIG. 1 shows an example of a schematic configuration of a radio base station apparatus 1 for use in a mobile communication system A.

As shown in FIG. 1, the radio base station apparatus 1 includes a modulation/demodulation function section MDE-A for the mobile communication system A, an amplification function AMP (amplifier section PA), an outdoor reception amplifier OA-RA and an antenna ANT.

Note that, the modulation/demodulation function section MDE-A for the mobile communication system A and the amplification function AMP are located indoors in a station building; the antenna ANT is located outdoors in a high place; and the outdoor reception amplifier OA-RA is located in the vicinity immediately below the outdoor antenna ANT.

In recent years, it has been demanded to provide, by using a single radio base station apparatus as described above, a service not only in the mobile communication system A, but also in a mobile communication system B having a frequency band close to that of the mobile communication system A.

In order to provide a service in the mobile communication system B as well as in the mobile communication system A as described above, it is conceived, as shown in FIG. 2, that a modulation/demodulation function section MDE-B for the mobile communication system B and a shared amplification function (hereinafter, shared AMP) shared by the mobile communication systems A and B are added to the configuration of the radio base station apparatus 1 shown in FIG. 1.

Note that, the shared AMP, as well as the modulation/demodulation function section MDE-A for the mobile communication system A and the modulation/demodulation function section MDE-B for the mobile communication system B, are located indoors in the station building.

Patent Document 1: JP-A-2003-115793

DISCLOSURE OF THE INVENTION

However, there have been the following problems, when the radio base station apparatus has a configuration in which the modulation/demodulation function section MDE-B for the mobile communication system B is added to the configuration of the radio base station apparatus 1 shown in FIG. 1 and the amplification function AMP shown in FIG. 1 is replaced with the shared AMP, for the purpose of providing a service in both the mobile communication systems A and B by the existing radio base station apparatus 1 shown in FIG. 1 as described above.

Firstly, multiple types of the existing modulation/demodulation function sections MDE-A for the mobile communication system A are present, and power levels of transmission radio frequency signals for the mobile communication system A inputted to the shared AMP are not the same among the multiple types of the modulation/demodulation function sections MDE-A for the mobile communication system A. For this reason, there has been a problem that power levels outputted from the shared AMP differ among the types of the modulation/demodulation function sections MDE-A for the mobile communication system A.

Secondly, if the performance of a common amplifier section PA in the shared AMP is adjusted to suit the mobile communication system B, the mobile communication system A cannot maintain transmission radio frequency signals for the mobile communication system A at the same power level as in the case where the mobile communication system A is operated alone. This poses a problem that the mobile communication system A cannot maintain a service area as large as the area in the singly-operated state.

Thirdly, reception radio frequency signals received by the shared AMP are divided by a divider section DIV into the reception radio frequency signals for the mobile communication system A and the reception radio frequency signals for the mobile communication system B. As a result, there has been a problem that a reception sensitivity of each of the mobile communication systems A and B is reduced.

Accordingly, the present invention has been made in view of the above problems, and an object of the present invention is to provide a radio base station apparatus capable of solving, with a minimum modification, the above-mentioned problem of a reduction in service quality even when the existing radio base station apparatus 1 provides services in both the mobile communication systems A and B.

A first aspect of the present invention is summarized as a radio base station apparatus including a shared amplification function configured to amplify both a transmission signal for a first mobile communication system and a transmission signal for a second mobile communication system, wherein the shared amplification function includes: a transmission/reception processor section for the second mobile communication system configured to perform frequency conversion processing on an inputted transmission baseband signal for the second mobile communication system, and to output a transmission radio frequency signal for the second mobile communication system; a power level adjuster section configured to adjust a power level of an inputted transmission radio frequency signal for the first mobile communication system; a combiner section configured to generate a transmission radio frequency signal, by combining the transmission radio frequency signal for the first mobile communication system outputted from the power level adjuster section and the transmission radio frequency signal for the second mobile communication system outputted from the transmission/reception processor section for the second mobile communication system; and a common amplifier section configured to amplify a power level of the transmission radio frequency signal outputted from the combiner section at a predetermined amplification rate, and to output the resultant signal.

According to the invention, even when power levels of transmission radio frequency signals for the first mobile communication system inputted to the shared AMP are not the same among the multiple types of the modulation/demodulation function sections MDE-A for the first mobile communication system (A), a power level adjuster section VA is capable of adjusting the power levels.

Additionally, according to the invention, when performance of the common amplifier section PA in the shared AMP is adjusted to suit the second mobile communication system, the transmission radio frequency signals for the first mobile communication system can be outputted, without modifying an existing transmission/reception processor TRX-A for the first mobile communication system, at an appropriate power level (i.e., at a power level of the transmission radio frequency signals for the first mobile communication system in the case where the first mobile communication system is operated alone).

In the first aspect, the transmission/reception processor section for the second mobile communication system can be configured to adjust a power level of the transmission radio frequency signal for the second mobile communication system to be equal to a power level of the transmission radio frequency signal for the first mobile communication system outputted from the power level adjuster section.

According to the invention, areas for both the first and second mobile communication systems can be maintained as large as the areas respectively covered by radio base station apparatuses, and a high service quality can be also maintained over the entire service areas.

In the first aspect, the shared amplification function can include: an auxiliary amplifier section configured to amplify a received reception radio frequency signal at a predetermined amplification rate, the reception radio frequency signal including a reception radio frequency signal for the first mobile communication system and a reception radio frequency signal for the second mobile communication system; and a divider section configured to divide the reception radio frequency signal outputted from the auxiliary amplifier section into the reception radio frequency signal for the first mobile communication system and the reception radio frequency signal for the second mobile communication system, and to output the resultant signals to a transmission/reception processor section for the first mobile communication system and the transmission/reception processor for the second mobile communication system, respectively, and the transmission/reception processor section for the second mobile communication system can be configured to perform frequency conversion processing on the reception radio frequency signal for the second mobile communication system outputted from the divider section, and to output the reception baseband signal for the second mobile communication system.

In the first aspect, the shared amplification function can include: a divider section configured to divide a received reception radio frequency signal into a reception radio frequency signal for the first mobile communication system and a reception radio frequency signal for the second mobile communication system; a first auxiliary amplifier section configured to amplify the reception radio frequency signal for the first mobile communication system outputted from the divider section at a predetermined amplification rate, and to output the resultant signal to a transmission/reception processor section for the first mobile communication system; and a second auxiliary amplifier section configured to amplify the reception radio frequency signal for the second mobile communication system outputted from the divider section at a predetermined amplification rate, and to output the resultant signal to the transmission/reception processor section for the second mobile communication system, and the transmission/reception processor section for the second mobile communication system can be configured to perform frequency conversion processing on the reception radio frequency signal for the second mobile communication system outputted from the second auxiliary amplifier section, and to output the reception baseband signal for the second mobile communication system.

According to the invention, since a power level (signal intensity) of the received reception radio frequency signals can be compensated by the auxiliary amplifier section, each of the first and second mobile communication systems can ensure the same service area as in the case where the first mobile communication system provides a service in a singly-operated state.

In the first aspect, the shared amplification function can include: a first isolator section provided between the power level adjuster section and the combiner section; and a second isolator section provided between the transmission/reception processor section for the second mobile communication system and the combiner section, the first isolator section can be configured to allow only a signal, which goes in a direction from the power level adjuster section to the combiner section, to pass therethrough, and the second isolator section can be configured to allow only a signal, which goes in a direction from the transmission/reception processor section for the second mobile communication system to the combiner section, to pass therethrough.

The invention makes it possible to: avoid a situation where the transmission radio frequency signals for the first mobile communication system inputted to a combiner section COM flow in the direction of a transmission/reception processor section TRX-B for the second mobile communication system due to undesired characteristics of the combiner section COM; and avoid a situation where the transmission radio frequency signals for the second mobile communication system inputted to the combiner section COM flow in the direction of the transmission/reception processor section TRX-A for the first mobile communication system due to undesired characteristics of the combiner COM.

In the first aspect, the shared amplification function can include the transmission/reception processor section for the second mobile communication system, the power level adjuster section, the combiner section, and the common amplifier section, for at least two systems.

As described above, the present invention makes it possible to provide a radio base station apparatus capable of solving, with a minimum modification, the above-mentioned problem of a reduction in service quality even when the existing radio base station apparatus 1 provides services in both the mobile communication systems A and B.

BEST MODES FOR CARRYING OUT THE INVENTION (Configuration of Radio Base Station Apparatus According To First Embodiment of Present Invention)

Figure 1:
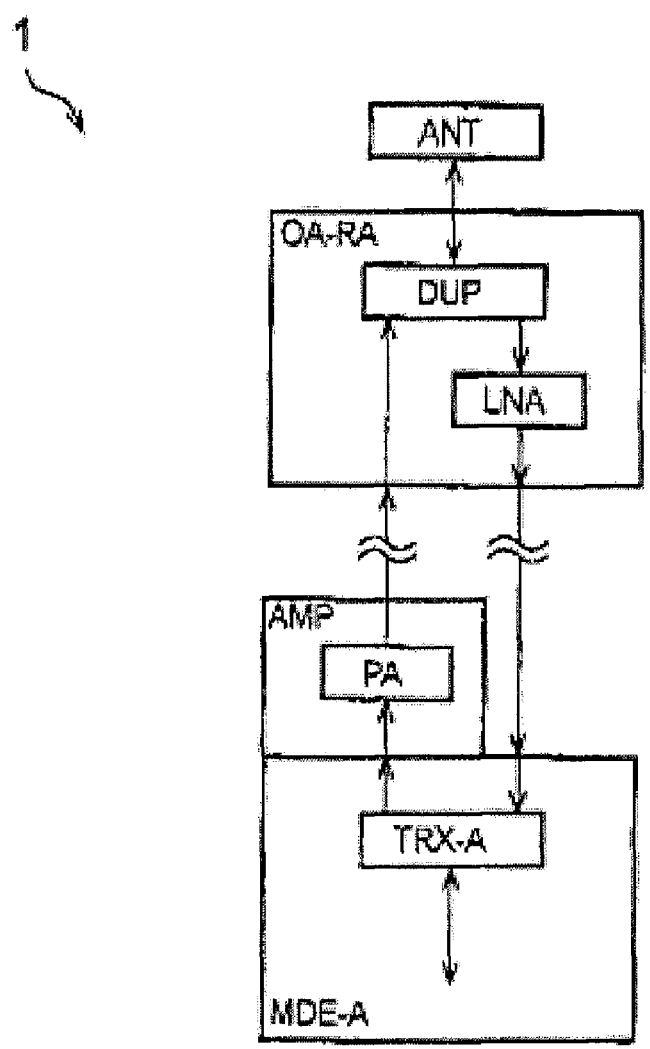
FIG. 1 is a schematic configuration diagram of a conventional radio base station apparatus.
Figure 2:
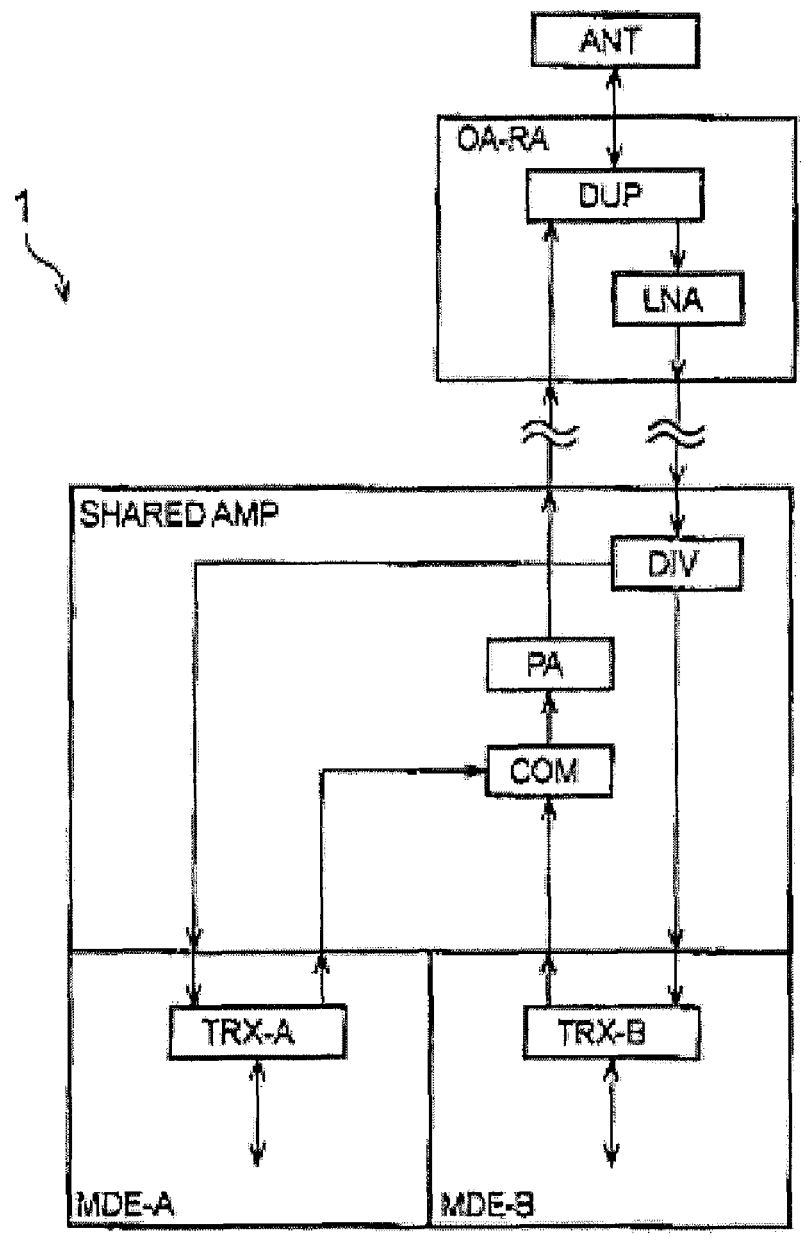
FIG. 2 is a schematic configuration diagram of a conventional radio base station apparatus.
Figure 3:
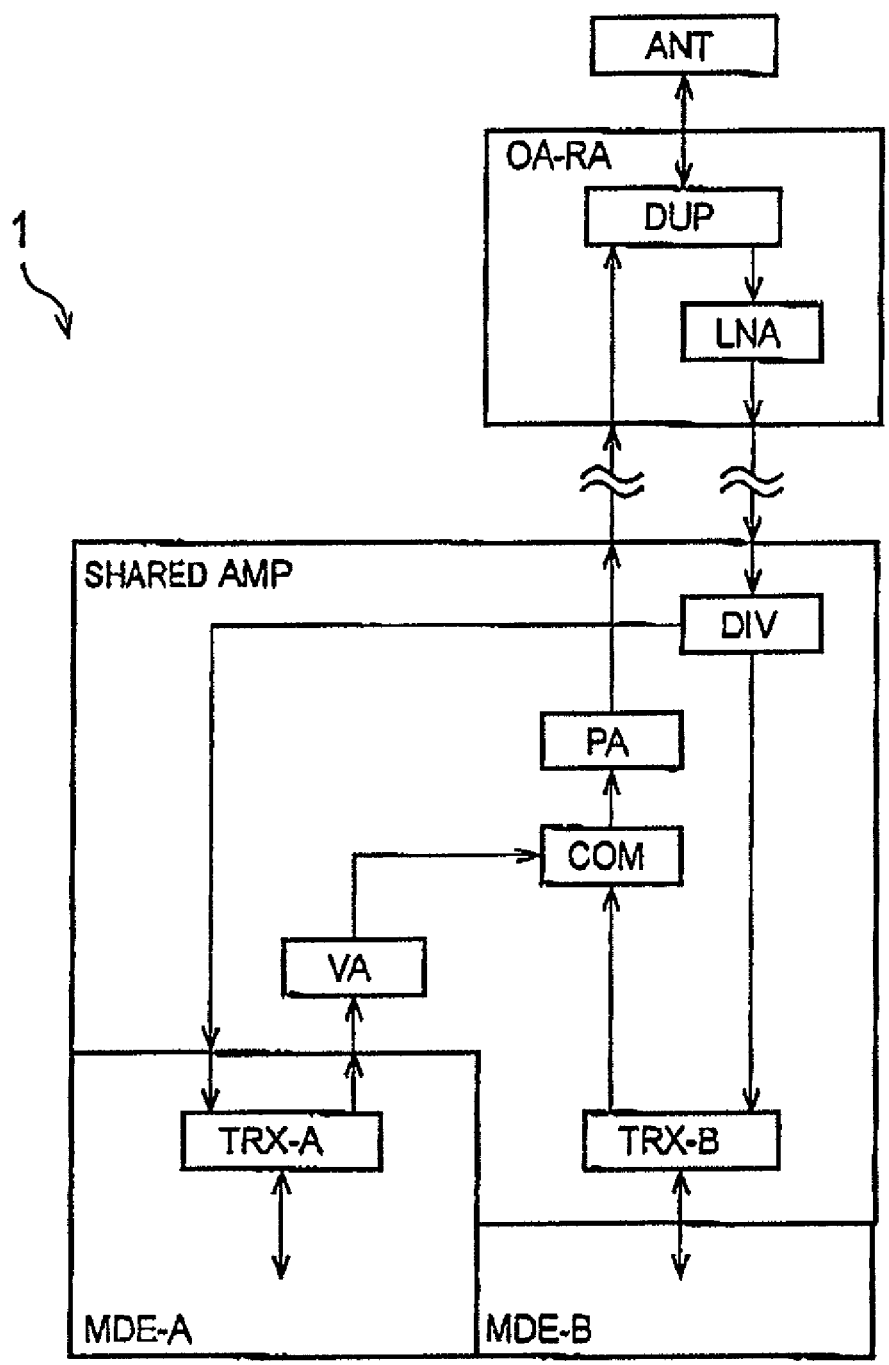
FIG. 3 is a schematic configuration diagram of a radio base station apparatus according to a first embodiment of the present invention.

Referring to FIG. 3, description will be given of a configuration of a radio base station apparatus 1 according to a first embodiment of the present invention.

The radio base station apparatus 1 is configured to provide a service to both a mobile communication system A (first mobile communication system) and a mobile communication system B (second mobile communication system).

For example, the radio base station apparatus 1 according to the present embodiment may be configured to provide a service to: as the mobile communication system A, a mobile communication system of the W-CDMA scheme; and, as the mobile communication system B, a mobile communication system of the LTE (Long Term Evolution) scheme.

Alternatively, the radio base station apparatus 1 according to the present embodiment may be configured to provide a service to: as the mobile communication system A, a mobile communication system of the HSPA (High Speed Packet Access) scheme; and, as the mobile communication system B, a mobile communication system of the LTE scheme.

Still alternatively, the radio base station apparatus 1 according to the present embodiment may be configured to provide a service to: as the mobile communication system A, a mobile communication system of the EVDO (Evolution Data Only) scheme; and, as the mobile communication system B, a mobile communication system of the UMB (Ultra Mobile Broadband) scheme.

To be specific, as shown in FIG. 3, the radio base station apparatus 1 includes a modulation/demodulation function section MDE-A for the mobile communication system A, a modulation/demodulation function section MDE-B for the mobile communication system B, a shared amplification function AMP (shared AMP), an outdoor reception amplifier OA-RA and an antenna ANT.

Note that, the modulation/demodulation function section MDE-A for the mobile communication system A, the modulation/demodulation function section MDE-B for the mobile communication system B and the shared AMP are located indoors in a station building; the antenna ANT is located outdoors in a high place; and the outdoor reception amplifier OA-RA is located in the vicinity immediately below the outdoor antenna ANT.

The antenna ANT is configured to transmit and receive radio frequency signals to and from mobile stations (not illustrated).

The outdoor reception amplifier OA-RA includes: a transmission/reception duplexer DUP configured to separate and multiplex reception radio frequency signals received via the antenna ANT and transmission radio frequency signals transmitted via the antenna; and a low-noise amplifier LNA configured to amplify a power level of the received reception radio frequency signals.

The modulation/demodulation function section MDE-A for the mobile communication system A includes a transmission/reception processor section TRX-A for the mobile communication system A (transmission/reception processor section for the first mobile communication system) configured to convert reception radio frequency signals for the mobile communication system A (reception radio frequency signals for the first mobile communication system) to ones with low frequency, and to convert transmission baseband signals for the mobile communication system A (transmission baseband signals for the first mobile communication system) to ones with high frequency.

In this regard, the transmission/reception processor section TRX-A for the mobile communication system A is configured to transmit and receive radio frequency signals to and from the shared AMP.

In addition, the transmission/reception processor section TRX-A for the mobile communication system A is configured to separate and multiplex transmission/reception signals.

Moreover, the modulation/demodulation function section MDE-A for the mobile communication system A includes a function configured to perform modulation/demodulation processing on transmission/reception signals.

Furthermore, the modulation/demodulation function section MDE-B for the mobile communication system B includes a function configured to perform modulation/demodulation processing on transmission/reception signals.

The shared AMP is configured to amplify both transmission signals for the mobile communication system A and transmission signals for the mobile communication system B.

To be specific, the shared AMP includes a divider section DIV, a common amplifier section PA, a combiner section COM, a power level adjuster section VA and a transmission/reception processor section TRX-B for the mobile communication system B.

The transmission/reception processor section TRX-B for the mobile communication system B is configured to perform frequency conversion processing on inputted transmission baseband signals for the mobile communication system B (transmission baseband signals for the second mobile communication system), and to output transmission radio frequency signals for the mobile communication system B (transmission radio frequency signals for the second mobile communication system).

Here, the transmission/reception processor section TRX-B for the mobile communication system B may be configured to receive, from the modulation/demodulation function section MDE-B for the mobile communication system B, transmission baseband signals for the mobile communication system B as optical signals, or transmission baseband signals for the mobile communication system B as electrical signals.

Additionally, the transmission/reception processor section TRX-B for the mobile communication system B is configured to perform frequency conversion processing on inputted reception radio frequency signals for the mobile communication system B (reception radio frequency signals for the second mobile communication system), and to output reception baseband signals for the mobile communication system B (reception baseband signals for the second mobile communication system).

In addition, the transmission/reception processor section TRX-B for the mobile communication system B may include a function to make fine adjustments to a power level of the transmission radio frequency signals for the mobile communication system B, so as to make fine adjustments to an area in which a service is provided by the mobile communication system B.

For example, the transmission/reception processor section TRX-B for the mobile communication system B may be configured to adjust a power level of the transmission radio frequency signals for the mobile communication system B, so that the power level of the transmission radio frequency signals for the mobile communication system B may be equal to a power level of the transmission radio frequency signals for the mobile communication system A outputted from the power level adjuster section VA.

The power level adjuster section VA is configured to adjust the power level of the transmission radio frequency signals for the mobile communication system A outputted from the transmission/reception processor section TRX-A for the mobile communication system A.

In this regard, the power level adjuster section VA is configured to adjust a power level of the transmission radio frequency signals for the mobile communication system A, so that the power level of the transmission radio frequency signals for the mobile communication system A may be adjusted to the lowest power level among power levels of the transmission radio frequency signals for the mobile communication system A outputted from multiple types of the modulation/demodulation function sections MDE-A for the mobile communication system A.

The combiner section COM is configured to generate a transmission radio frequency signal by combining transmission radio frequency signals for the mobile communication system A outputted from the power level adjuster section VA and transmission radio frequency signals for the mobile communication system B outputted from the transmission/reception processor section TRX-B for the mobile communication system B.

Here, in the combiner section COM, each of the power levels of the transmission radio frequency signals for the mobile communication systems A and B is attenuated to half or less.

The common amplifier section PA is configured to amplify, at a predetermined amplification rate, a power level of the transmission radio frequency signal outputted from the combiner section COM, and to output the resultant signal to the outdoor reception amplifier OA-RA. In other words, the amount of the level of power having been attenuated in the combiner section COM is compensated in the common amplifier section PA.

In this regard, the transmission/reception duplexer DUP of the outdoor reception amplifier OA-RA is configured to transmit, via the antenna ANT to a mobile station, the transmission radio frequency signal outputted from the common amplifier section PA.

In addition, the transmission/reception duplexer DUP of the outdoor reception amplifier OA-RA is configured to output, via the antenna ANT to the low-noise amplifier LNA, reception radio frequency signals received from a mobile station.

The divider section DIV is configured to divide reception radio frequency signals received from the low-noise amplifier LNA of the outdoor reception amplifier OA-RA into reception radio frequency signals for the mobile communication system A and reception radio frequency signals for the mobile communication system B, and to output the resultant signals to the transmission/reception processor section TRX-A for the mobile communication system A and the transmission/reception processor section TRX-B for the mobile communication system B, respectively.

Here, each of power levels of the reception radio frequency signals for the mobile communication systems A and B outputted from the divider section DIV is equal to or less than half the power level of the transmission radio frequency signals thereof.

Note that, the transmission/reception processor section TRX-A for the mobile communication system A is configured to perform frequency conversion processing on the reception radio frequency signals for the mobile communication system A outputted from the divider section DIV, and to output reception baseband signals for the mobile communication system A.

Additionally, the transmission/reception processor section TRX-B for the mobile communication system B is configured to perform frequency conversion processing on the reception radio frequency signals for the mobile communication system B outputted from the divider section DIV, and to output reception baseband signals for the mobile communication system B.

In the present embodiment, the radio base station apparatus 1 is configured to provide a service to each of two different mobile communication systems A and B. However, the present invention is not limited to this, and is also applicable to the radio base station apparatus 1 capable of providing services to three or more of different mobile communication systems. In this case, the present invention can be applied thereto by increasing the number of output branches of the divider section DIV and the number of input branches of the combiner section COM.

(Advantageous Effect of Radio Base Station Apparatus 1 According to First Embodiment of Present Invention)

In the radio base station apparatus 1 according to the first embodiment of the present invention, even when power levels of transmission radio frequency signals for the mobile communication system A inputted to the shared AMP are not the same among the multiple types of the modulation/demodulation function sections MDE-A for the mobile communication system A, the power level adjuster section VA is capable of adjusting the power levels thereof.

Additionally, if the performance of the common amplifier section PA in the shared AMP is adjusted to that of the mobile communication system B, the radio base station apparatus 1 according to the first embodiment of the present invention can output the transmission radio frequency signals for the first mobile communication system A without modifying the existing transmission/reception processor section TRX-A for the first mobile communication system, at an appropriate power level (i.e., at a power level of the transmission radio frequency signals for the mobile communication system A in the case where the mobile communication system A is operated alone).

In the radio base station apparatus 1 according to the first embodiment of the present invention, areas for both the mobile communication systems A and B can be maintained as large as the areas respectively covered by radio base station apparatuses, and a high service quality can be also maintained over the entire service areas.

In other words, the radio base station apparatus 1 according to the first embodiment of the present invention makes it possible to prevent occurrence of a situation where the overlapping of areas for both the mobile communication systems covered by different radio base station apparatuses 1 increases interference between cells, so that each service area is reduced in size or that a service cannot be provided to an end of each area because radio waves fail to reach the end.

(Radio Base Station Apparatus According to Second Embodiment of Present Invention)

Next, referring to FIG. 4, a radio base station apparatus 1 according to a second embodiment of the present invention will be described mainly about the difference from the radio base station apparatus 1 according to the above-mentioned first embodiment.

Figure 4:
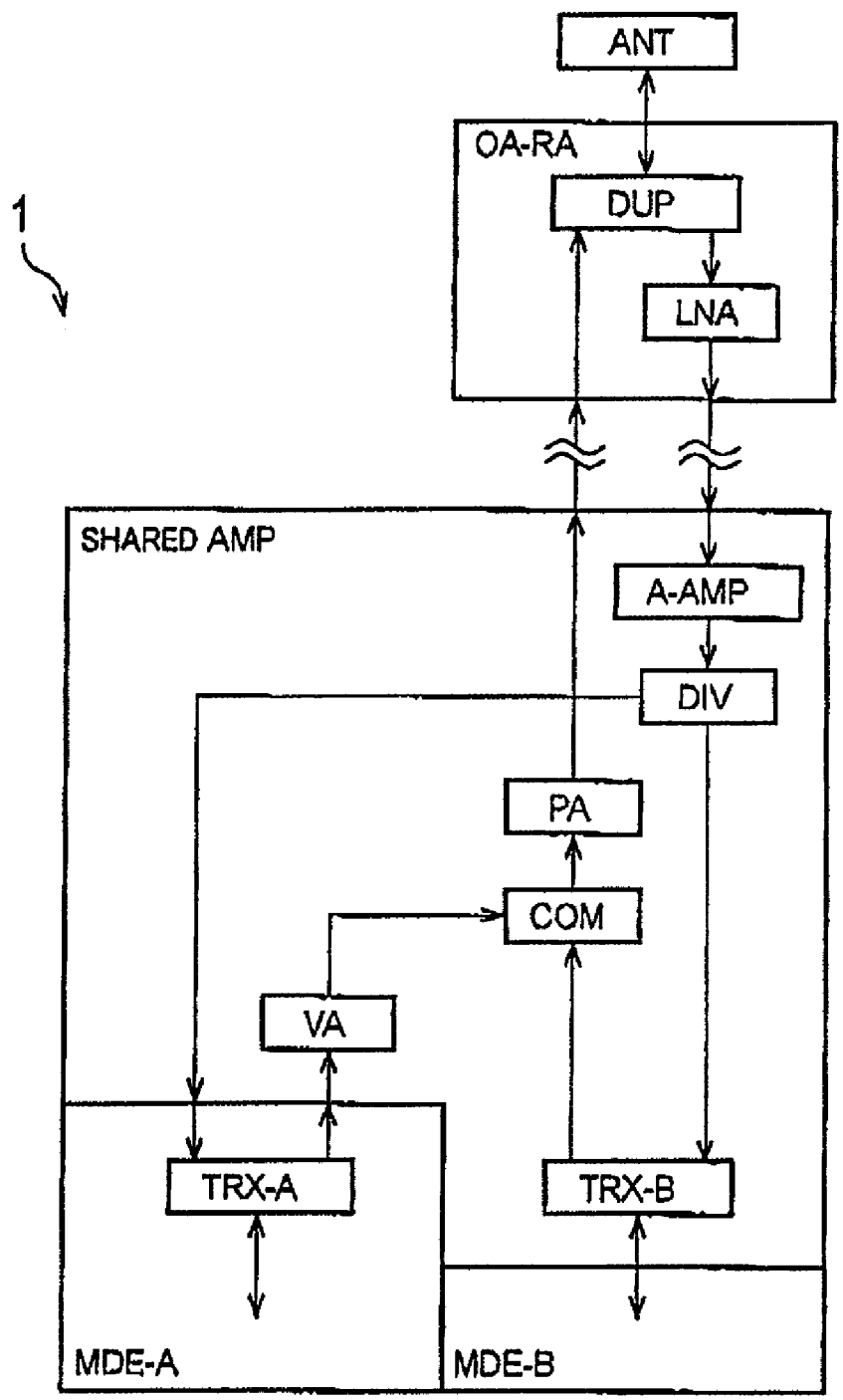
FIG. 4 is a schematic configuration diagram of a radio base station apparatus according to a second embodiment of the present invention.

As shown in FIG. 4, a configuration of the radio base station apparatus 1 according to the present embodiment is the same as the configuration of the radio base station apparatus 1 according to the above-mentioned first embodiment except that an auxiliary amplifier section A-AMP is provided in the shared AMP.

To be specific, the auxiliary amplifier section A-AMP is configured to receive a reception radio frequency signal including reception radio frequency signals for the mobile communication systems A and B from the outdoor reception amplifier OA-RA, and to amplify the received reception radio frequency signal at a predetermined amplification rate.

In addition, the divider section DIV is configured to divide the reception radio frequency signal outputted from the auxiliary amplifier section A-AMP into the reception radio frequency signals for the mobile communication system A and the reception radio frequency signals for the mobile communication system B, and to output the resultant signals to the transmission/reception processor section TRX-A for the mobile communication system A and the transmission/reception processor section TRX-B for the mobile communication system B, respectively.

In the radio base station apparatus 1 according to the present embodiment, a power level (signal intensity) of the received reception radio frequency signals can be compensated by the auxiliary amplifier section A-AMP. Accordingly, the mobile communication system A can ensure a service area as large as the area in the singly-operated state, and the mobile communication system B can ensure a service area as large as the area in the singly-operated state.

(Radio Base Station Apparatus According to Third Embodiment of Present Invention)

Next, referring to FIG. 5, a radio base station apparatus 1 according to a third embodiment of the present invention will be described mainly about the difference from the radio base station apparatus 1 according to the above-mentioned first embodiment.

Figure 5:
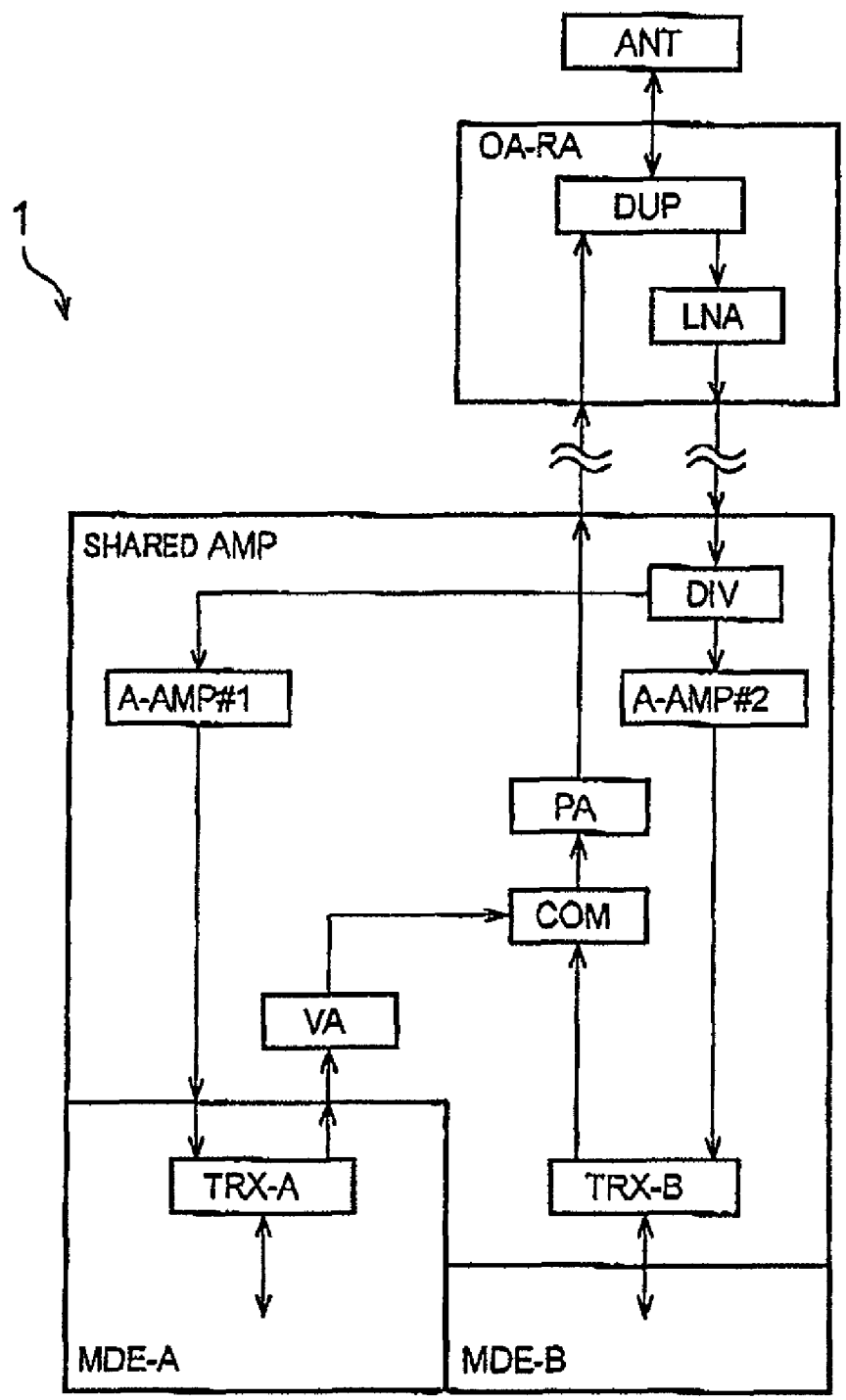
FIG. 5 is a schematic configuration diagram of a radio base station apparatus according to a third embodiment of the present invention.

As shown in FIG. 5, a configuration of the radio base station apparatus 1 according to the present embodiment is the same as the configuration of the radio base station apparatus 1 according to the above-mentioned first embodiment except that a first auxiliary amplifier section A-AMP#1 and a second auxiliary amplifier section A-AMP#2 are provided in the shared AMP.

To be specific, the divider section DIV is configured to receive, from the outdoor reception amplifier OA-RA, a reception radio frequency signal including reception radio frequency signals for the mobile communication system A and reception radio frequency signals for the mobile communication system B, and to divide the received reception radio frequency signal into the reception radio frequency signals for the mobile communication system A and the reception radio frequency signals for the mobile communication system B.

In addition, the first auxiliary amplifier section A-AMP#1 is configured to amplify the reception radio frequency signals for the mobile communication system A outputted from the divider section DIV at a predetermined amplification rate, and to output the resultant signals to the transmission/reception processor section TRX-A for the mobile communication system A.

Moreover, the second auxiliary amplifier section A-AMP#2 is configured to amplify the reception radio frequency signals for the mobile communication system B outputted from the divider section DIV at a predetermined amplification rate, and to output the resultant signals to the transmission/reception processor section TRX-B for the mobile communication system B.

In the radio base station apparatus 1 according to the present embodiment, a power level (signal intensity) of the received reception radio frequency signals can be compensated by each of the auxiliary amplifier section A-AMP#1 and the auxiliary amplifier section A-AMP#2. Accordingly, the mobile communication systems A and B can each ensure a service area as large as the area which the mobile communication system A would have in the singly-operated state.

(Radio Base Station Apparatus according to Fourth Embodiment of Present Invention)

Next, referring to FIG. 6, a radio base station apparatus 1 according to a fourth embodiment of the present invention will be described mainly about the difference from the radio base station apparatus 1 according to the above-mentioned second embodiment.

Figure 6:
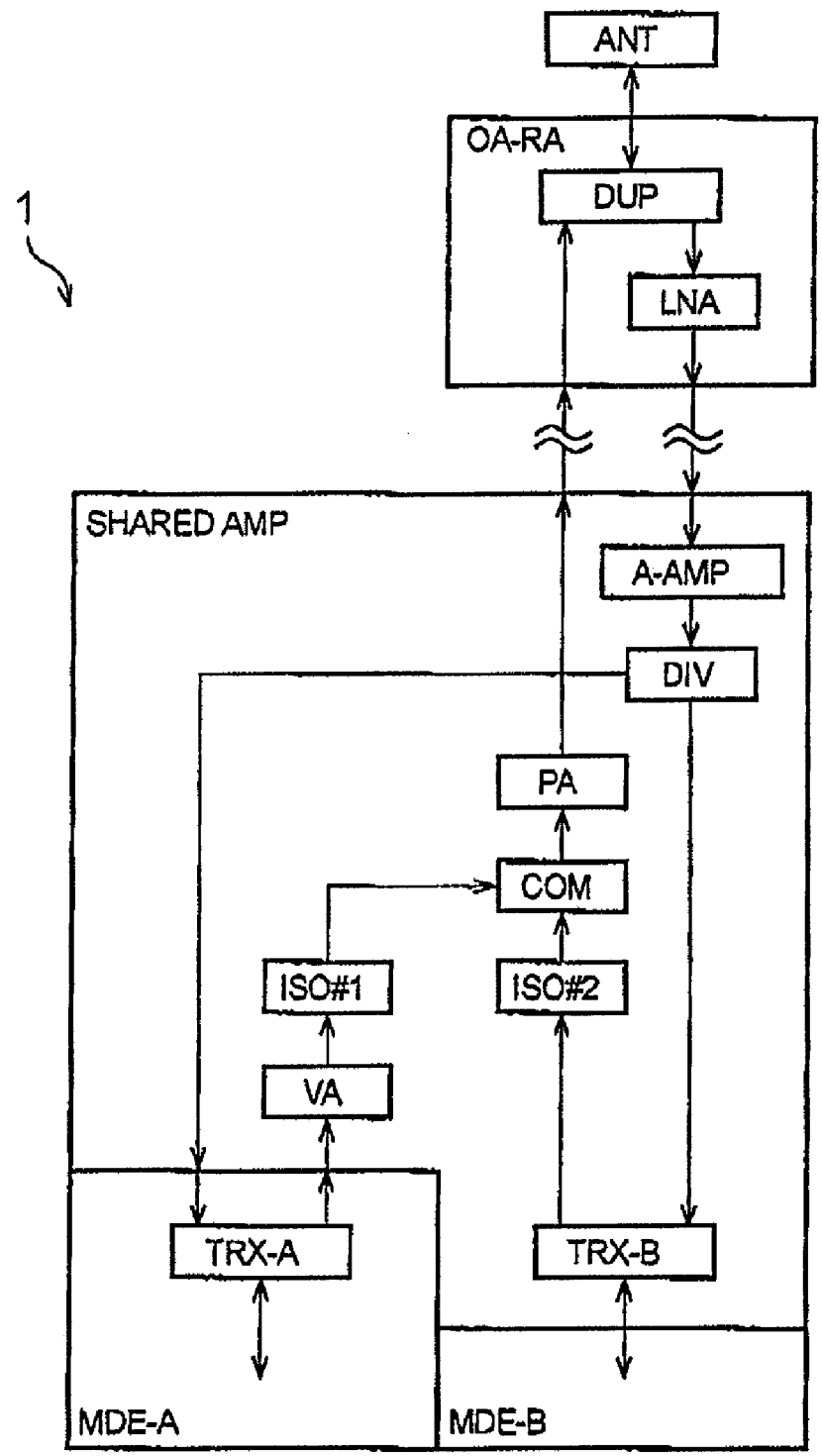
FIG. 6 is a schematic configuration diagram of a radio base station apparatus according to a fourth embodiment of the present invention.

As shown in FIG. 6, a configuration of the radio base station apparatus 1 according to the present embodiment is the same as the configuration of the radio base station apparatus 1 according to the above-mentioned second embodiment except that a first isolator ISO#1 and a second isolator ISO#2 are provided in the shared AMP.

To be specific, the first isolator ISO#1 is provided between the power level adjuster section VA and the combiner section COM, and is configured to allow, to pass therethrough, only signals in a direction from the power level adjuster section VA to the combiner section COM.

In addition, the second isolator ISO#2 is provided between the transmission/reception processor section TRX-B for the mobile communication system B and the combiner section COM, and is configured to allow, to pass therethrough, only signals in a direction from the transmission/reception processor section TRX-B for the mobile communication system B to the combiner section COM.

In the radio base station apparatus 1 according to the present embodiment, it is possible to avoid a situation where the transmission radio frequency signals for the mobile communication system A inputted to the combiner section COM flow in the direction of the transmission/reception processor section TRX-B for the mobile communication system B due to undesired characteristics of the combiner section COM. In addition, it is possible to avoid a situation where the transmission radio frequency signals for the mobile communication system B inputted to the combiner section COM flow in the direction of the transmission/reception processor section TRX-A for the mobile communication system A due to undesired characteristics of the combiner section COM.

Note that, if the transmission radio frequency signals for the mobile communication system A inputted to the combiner section COM flow not in the direction of the common amplifier section PA but in the direction of the transmission/reception processor section TRX-B for the mobile communication system B due to undesired characteristics of the combiner section COM, an adverse effect is exerted on the transmission/reception processor section TRX-B for the mobile communication system B, whereby there is a possibility that the radio base station apparatus 1 does not operate properly.

Additionally, the same goes for a case where the transmission radio frequency signals for the mobile communication system. B inputted to the combiner section COM flow not in the direction of the common amplifier section PA but in the direction of the transmission/reception processor section TRX-A for the mobile communication system A due to undesired characteristics of the combiner COM.

(Radio Base Station Apparatus according to Fifth Embodiment of Present Invention)

Next, referring to FIG. 7, a radio base station apparatus 1 according to a fifth embodiment of the present invention will be described mainly about the difference from the radio base station apparatus 1 according to the above-mentioned first embodiment.

Figure 7:
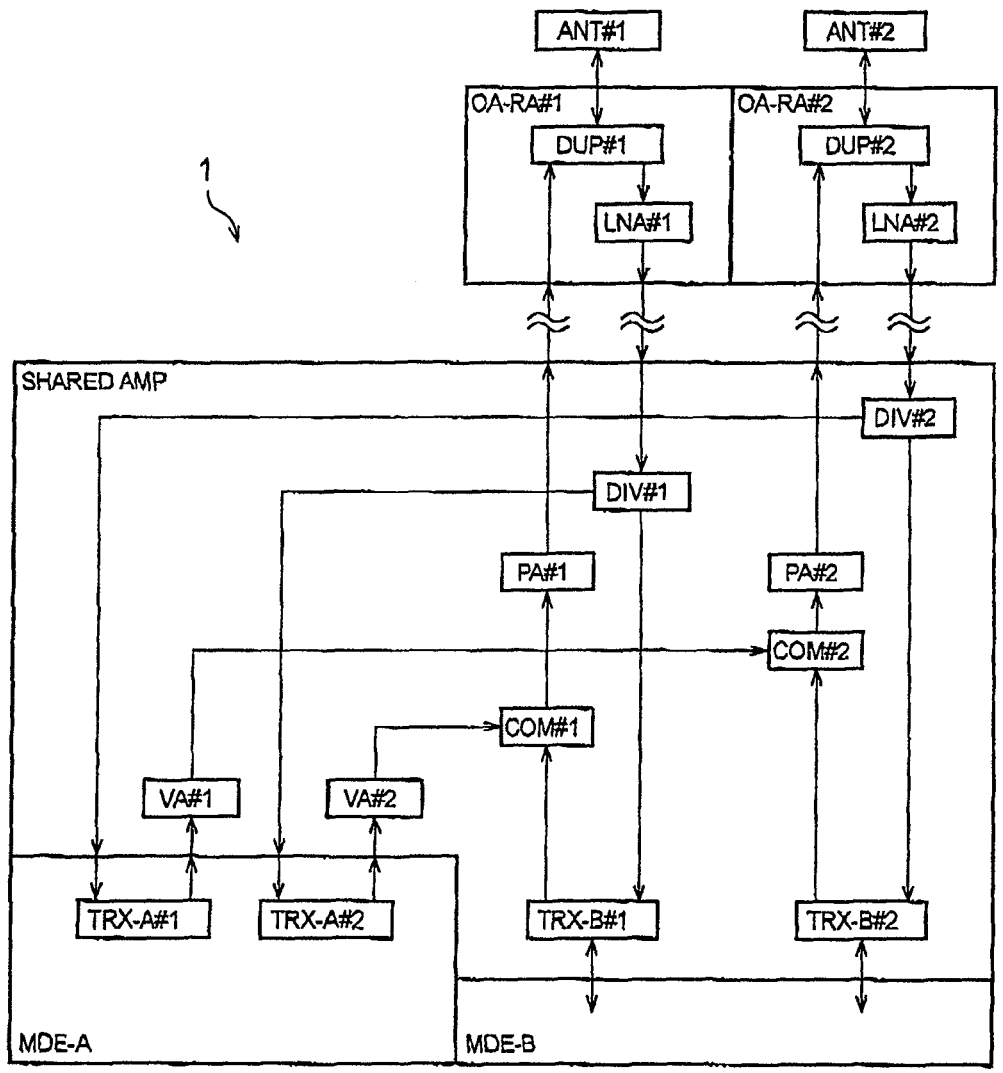
FIG. 7 is a schematic configuration diagram of a radio base station apparatus according to a fifth embodiment of the present invention.

As shown in FIG. 7, a configuration of the radio base station apparatus 1 according to the present embodiment is the same as the configuration of the radio base station apparatus 1 according to the above-mentioned first embodiment except that the shared AMP includes transmission configurations and reception configurations for at least two systems.

To be specific, the radio base station apparatus 1 according to the present embodiment includes two antennas ANT#1 and ANT#2, two outdoor reception amplifiers OA-RA#1 and OA-RA#2, the shared AMP, the modulation/demodulation function section MDE-A for the mobile communication system A, and the modulation/demodulation function section MDE-B for the mobile communication system B.

In addition, the modulation/demodulation function section MDE-A for the mobile communication system A includes two transmission/reception processor sections TRX-A#1 and TRX-A#2 for the mobile communication system A.

Additionally, the shared AMP includes two divider sections DIV#1 and DIV#2, two common amplifier sections PA#1 and PA#2, two combiner sections COM#1 and COM#2, two variable attenuator sections VA#1 and VA#2, and two transmission/reception processor sections TRX-B#1 and TRX-B#2 for the mobile communication system B.

Here, in FIG. 7, a configuration provided with "#1" is a "first system" and a configuration provided with "#2" is a "second system". In addition, functions of a transmission configuration and a reception configuration of the "first system" are basically the same as functions of a transmission configuration and a reception configuration of the "second system". For this reason, descriptions for the respective configurations are omitted.

Note that, in the present embodiment, description has been given of the radio base station apparatus 1 capable of providing services to the two mobile communication systems. However, the present invention is not limited to this, and is also applicable to the radio base station apparatus 1 capable of providing services to three or more of different mobile communication systems.

(Radio Base Station Apparatus according to Sixth Embodiment of Present Invention)

Next, referring to FIG. 8, a radio base station apparatus 1 according to a sixth embodiment of the present invention will be described mainly about the difference from the radio base station apparatus 1 according to the above-mentioned fifth embodiment.

Figure 8:
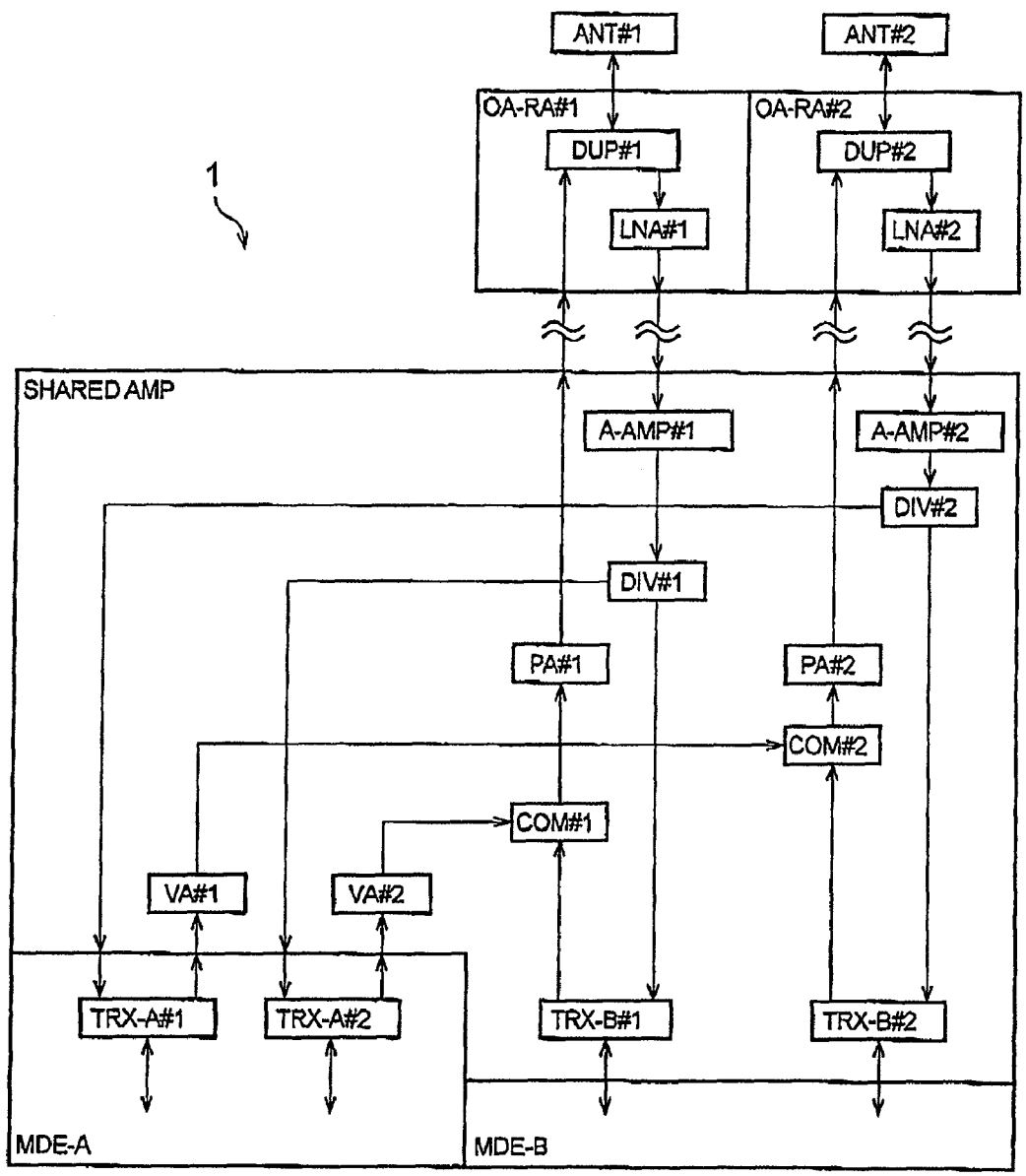
FIG. 8 is a schematic configuration diagram of a radio base station apparatus according to a sixth embodiment of the present invention.

As shown in FIG. 8, a configuration of the radio base station apparatus 1 according to the present embodiment is the same as the configuration of the radio base station apparatus 1 according to the above-mentioned fifth embodiment except that an auxiliary amplifier section A-AMP#1 and an auxiliary amplifier section A-AMP#2 are provided in the shared AMP, in the same manner as the above-mentioned second embodiment.

(Radio Base Station Apparatus according to Seventh Embodiment of Present Invention)

Next, referring to FIG. 9, a radio base station apparatus 1 according to a seventh embodiment of the present invention will be described mainly about the difference from the radio base station apparatus 1 according to the above-mentioned fifth embodiment.

Figure 9:
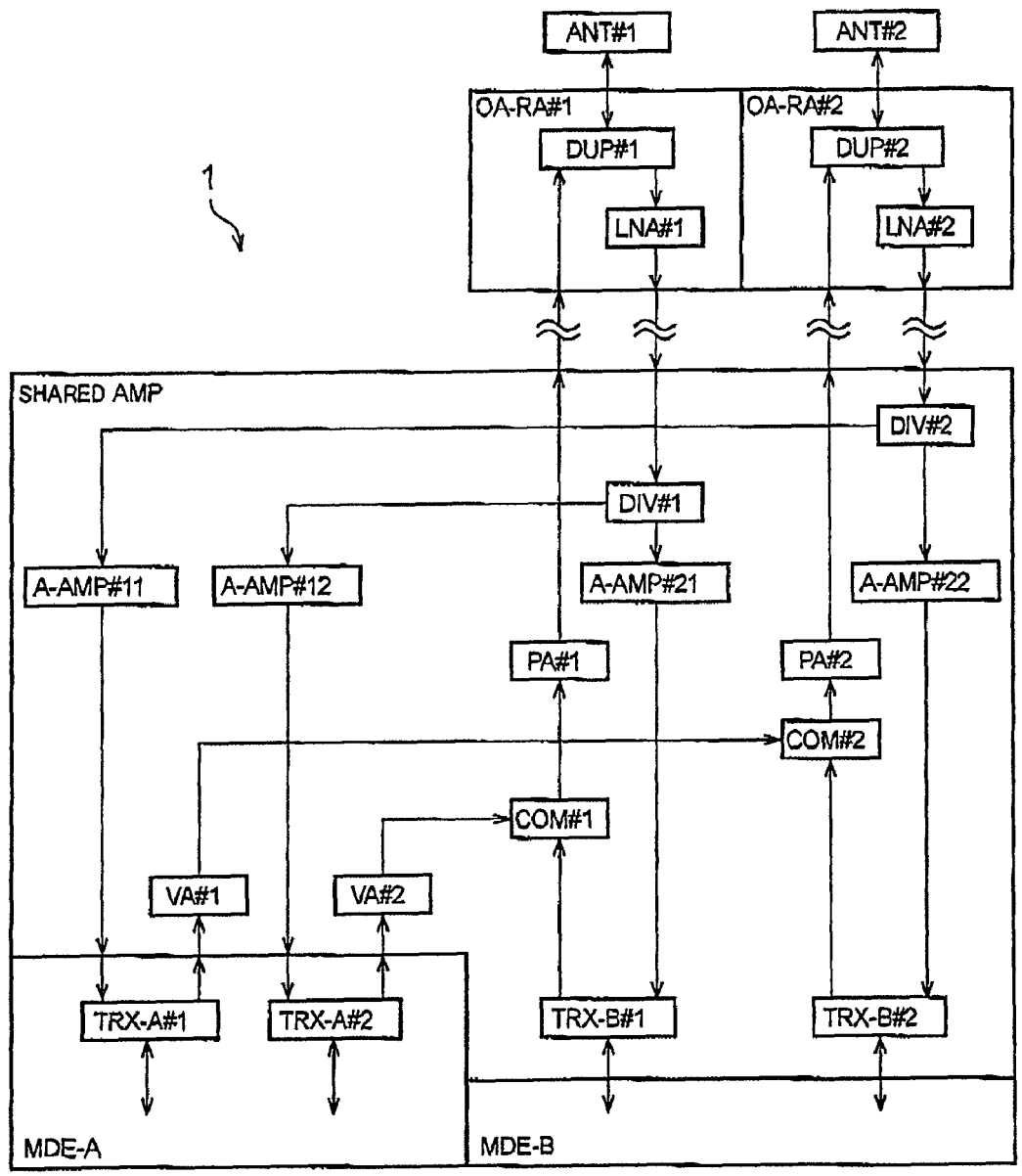
FIG. 9 is a schematic configuration diagram of a radio base station apparatus according to a seventh embodiment of the present invention.

As shown in FIG. 9, a configuration of the radio base station apparatus 1 according to the present embodiment is the same as the configuration of the radio base station apparatus 1 according to the above-mentioned fifth embodiment except that first auxiliary amplifier sections A-AMP#11 and A-AMP#12 as well as second auxiliary amplifier sections A-AMP#21 and A-AMP#22 are provided in the shared AMP, in the same manner as the above-mentioned third embodiment.

(Radio Base Station Apparatus according to Eighth Embodiment of Present Invention)

Next, referring to FIG. 10, a radio base station apparatus 1 according to an eighth embodiment of the present invention will be described mainly about the difference from the radio base station apparatus 1 according to the above-mentioned sixth embodiment.

Figure 10:
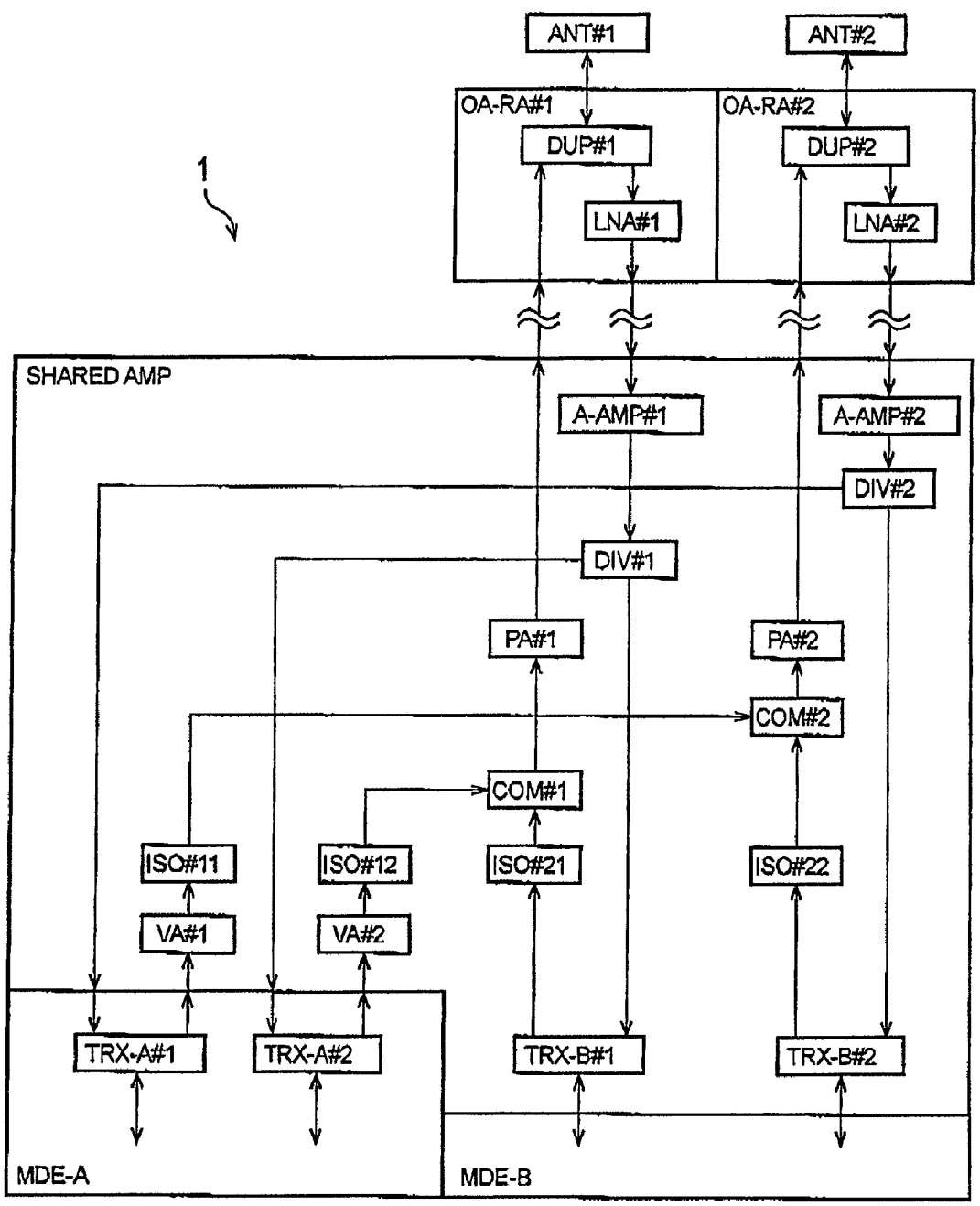
FIG. 10 is a schematic configuration diagram of a radio base station apparatus according to an eighth embodiment of the present invention.

As shown in FIG. 10, a configuration of the radio base station apparatus 1 according to the present embodiment is the same as the configuration of the radio base station apparatus 1 according to the above-mentioned sixth embodiment except that first isolators ISO#11 and ISO#12 as well as second isolators ISO#21 and ISO#22 are provided in the shared AMP, in the same manner as the above-mentioned fourth embodiment.

As described above, detailed description has been given of the present invention using the above-mentioned embodiments. However, it is obvious for those skilled in the art that the present invention is not limited to the embodiments explained herein. The present invention can be practiced as modified or altered embodiments within the spirit and scope of the present invention defined by the description of the appended claims. Thus, the description herein is for illustrative purposes, and does not intend to limit the present invention whatsoever.

It should be understood that the entire contents of Japanese Patent Application No. 2007-192696 (filed on Jul. 24, 2007) are herein incorporated by reference.

Industrial Applicability

As described above, a radio base station apparatus according to the present invention is useful because, even when the existing radio base station apparatus 1 provides services in both the mobile communication systems A and B, the radio base station apparatus is capable of solving, with a minimum modification, the problem of a reduction in service quality.

The invention claimed is:

1. A radio base station apparatus comprising a shared amplification function configured to amplify both a transmission signal for a first mobile communication system and a transmission signal for a second mobile communication system, wherein the shared amplification function comprises:

a transmission/reception processor section for the second mobile communication system configured to perform frequency conversion processing on an inputted transmission baseband signal for the second mobile communication system, and to output a transmission radio frequency signal for the second mobile communication system;

a power level adjuster section configured to adjust a power level of an inputted transmission radio frequency signal for the first mobile communication system;

a combiner section configured to generate a transmission radio frequency signal, by combining the transmission radio frequency signal for the first mobile communication system outputted from the power level adjuster section and the transmission radio frequency signal for the second mobile communication system outputted from the transmission/reception processor section for the second mobile communication system; and a common amplifier section configured to amplify a power level of the transmission radio frequency signal outputted from the combiner section at a predetermined amplification rate, and to output the resultant signal.

2. The radio base station apparatus according to claim 1, wherein
the transmission/reception processor section for the second mobile communication system is configured to adjust a power level of the transmission radio frequency signal for the second mobile communication system to be equal to a power level of the transmission radio frequency signal for the first mobile communication system outputted from the power level adjuster section.

3. The radio base station apparatus according to claim 2, wherein
the shared amplification function comprises:
an auxiliary amplifier section configured to amplify a received reception radio frequency signal at a predetermined amplification rate, the reception radio frequency signal including a reception radio frequency signal for the first mobile communication system and a reception radio frequency signal for the second mobile communication system; and
a divider section configured to divide the reception radio frequency signal outputted from the auxiliary amplifier section into the reception radio frequency signal for the first mobile communication system and the reception radio frequency signal for the second mobile communication system, and to output the resultant signals to a transmission/reception processor section for the first mobile communication system and the transmission/reception processor for the second mobile communication system, respectively, and
the transmission/reception processor section for the second mobile communication system is configured to perform frequency conversion processing on the reception radio frequency signal for the second mobile communication system outputted from the divider section, and to output the reception baseband signal for the second mobile communication system.

4. The radio base station apparatus according to claim 3, wherein
the shared amplification function comprises:
a first isolator section provided between the power level adjuster section and the combiner section; and
a second isolator section provided between the transmission/reception processor section for the second mobile communication system and the combiner section,
the first isolator section is configured to allow only a signal, which goes in a direction from the power level adjuster section to the combiner section, to pass therethrough, and
the second isolator section is configured to allow only a signal, which goes in a direction from the transmission/reception processor section for the second mobile communication system to the combiner section, to pass therethrough.

5. The radio base station apparatus according to claim 4, wherein
the shared amplification function comprises the transmission/reception processor section for the second mobile communication system, the power level adjuster section, the combiner section, and the common amplifier section, for at least two systems.

6. The radio base station apparatus according to claim 3, wherein
the shared amplification function comprises the transmission/reception processor section for the second mobile communication system, the power level adjuster section, the combiner section, and the common amplifier section, for at least two systems.

7. The radio base station apparatus according to claim 2, wherein
the shared amplification function comprises:
a divider section configured to divide a received reception radio frequency signal into a reception radio frequency signal for the first mobile communication system and a reception radio frequency signal for the second mobile communication system;
a first auxiliary amplifier section configured to amplify the reception radio frequency signal for the first mobile communication system outputted from the divider section at a predetermined amplification rate, and to output the resultant signal to a transmission/reception processor section for the first mobile communication system; and
a second auxiliary amplifier section configured to amplify the reception radio frequency signal for the second mobile communication system outputted from the divider section at a predetermined amplification rate, and to output the resultant signal to the transmission/reception processor section for the second mobile communication system, and
the transmission/reception processor section for the second mobile communication system is configured to perform frequency conversion processing on the reception radio frequency signal for the second mobile communication system outputted from the second auxiliary amplifier section, and to output the reception baseband signal for the second mobile communication system.

8. The radio base station apparatus according to claim 7, wherein
the shared amplification function comprises:
a first isolator section provided between the power level adjuster section and the combiner section; and
a second isolator section provided between the transmission/reception processor section for the second mobile communication system and the combiner section,
the first isolator section is configured to allow only a signal, which goes in a direction from the power level adjuster section to the combiner section, to pass therethrough, and
the second isolator section is configured to allow only a signal, which goes in a direction from the transmission/reception processor section for the second mobile communication system to the combiner section, to pass therethrough.

9. The radio base station apparatus according to claim 8, wherein
the shared amplification function comprises the transmission/reception processor section for the second mobile communication system, the power level adjuster section, the combiner section, and the common amplifier section, for at least two systems.

10. The radio base station apparatus according to claim 7, wherein
the shared amplification function comprises the transmission/reception processor section for the second mobile communication system, the power level adjuster section, the combiner section, and the common amplifier section, for at least two systems.

11. The radio base station apparatus according to claim 2, wherein
the shared amplification function comprises:
a first isolator section provided between the power level adjuster section and the combiner section; and
a second isolator section provided between the transmission/reception processor section for the second mobile communication system and the combiner section,
the first isolator section is configured to allow only a signal, which goes in a direction from the power level adjuster section to the combiner section, to pass therethrough, and
the second isolator section is configured to allow only a signal, which goes in a direction from the transmission/reception processor section for the second mobile communication system to the combiner section, to pass therethrough.

12. The radio base station apparatus according to claim 11, wherein
the shared amplification function comprises the transmission/reception processor section for the second mobile communication system, the power level adjuster section, the combiner section, and the common amplifier section, for at least two systems.

13. The radio base station apparatus according to claim 2, wherein
the shared amplification function comprises the transmission/reception processor section for the second mobile communication system, the power level adjuster section, the combiner section, and the common amplifier section, for at least two systems.

14. The radio base station apparatus according to claim 1, wherein
the shared amplification function comprises:
an auxiliary amplifier section configured to amplify a received reception radio frequency signal at a predetermined amplification rate, the reception radio frequency signal including a reception radio frequency signal for the first mobile communication system and a reception radio frequency signal for the second mobile communication system; and
a divider section configured to divide the reception radio frequency signal outputted from the auxiliary amplifier section into the reception radio frequency signal for the first mobile communication system and the reception radio frequency signal for the second mobile communication system, and to output the resultant signals to a transmission/reception processor section for the first mobile communication system and the transmission/reception processor for the second mobile communication system, respectively, and
the transmission/reception processor section for the second mobile communication system is configured to perform frequency conversion processing on the reception radio frequency signal for the second mobile communication system outputted from the divider section, and to output the reception baseband signal for the second mobile communication system.

15. The radio base station apparatus according to claim 14, wherein
the shared amplification function comprises:
a first isolator section provided between the power level adjuster section and the combiner section; and
a second isolator section provided between the transmission/reception processor section for the second mobile communication system and the combiner section,
the first isolator section is configured to allow only a signal, which goes in a direction from the power level adjuster section to the combiner section, to pass therethrough, and
the second isolator section is configured to allow only a signal, which goes in a direction from the transmission/reception processor section for the second mobile communication system to the combiner section, to pass therethrough.

16. The radio base station apparatus according to claim 15, wherein
the shared amplification function comprises the transmission/reception processor section for the second mobile communication system, the power level adjuster section, the combiner section, and the common amplifier section, for at least two systems.

17. The radio base station apparatus according to claim 14, wherein
the shared amplification function comprises the transmission/reception processor section for the second mobile communication system, the power level adjuster section, the combiner section, and the common amplifier section, for at least two systems.

18. The radio base station apparatus according to claim 1, wherein
the shared amplification function comprises:
a divider section configured to divide a received reception radio frequency signal into a reception radio frequency signal for the first mobile communication system and a reception radio frequency signal for the second mobile communication system;
a first auxiliary amplifier section configured to amplify the reception radio frequency signal for the first mobile communication system outputted from the divider section at a predetermined amplification rate, and to output the resultant signal to a transmission/reception processor section for the first mobile communication system; and
a second auxiliary amplifier section configured to amplify the reception radio frequency signal for the second mobile communication system outputted from the divider section at a predetermined amplification rate, and to output the resultant signal to the transmission/reception processor section for the second mobile communication system, and
the transmission/reception processor section for the second mobile communication system is configured to perform frequency conversion processing on the reception radio frequency signal for the second mobile communication system outputted from the second auxiliary amplifier section, and to output the reception baseband signal for the second mobile communication system.

19. The radio base station apparatus according to claim 18, wherein
the shared amplification function comprises:
a first isolator section provided between the power level adjuster section and the combiner section; and
a second isolator section provided between the transmission/reception processor section for the second mobile communication system and the combiner section,
the first isolator section is configured to allow only a signal, which goes in a direction from the power level adjuster section to the combiner section, to pass therethrough, and
the second isolator section is configured to allow only a signal, which goes in a direction from the transmission/ reception processor section for the second mobile communication system to the combiner section, to pass therethrough.

20. The radio base station apparatus according to claim 19, wherein
the shared amplification function comprises the transmission/reception processor section for the second mobile communication system, the power level adjuster section, the combiner section, and the common amplifier section, for at least two systems.

21. The radio base station apparatus according to claim 18, wherein
the shared amplification function comprises the transmission/reception processor section for the second mobile communication system, the power level adjuster section, the combiner section, and the common amplifier section, for at least two systems.

22. The radio base station apparatus according to claim 1, wherein
the shared amplification function comprises:
a first isolator section provided between the power level adjuster section and the combiner section; and
a second isolator section provided between the transmission/reception processor section for the second mobile communication system and the combiner section,
the first isolator section is configured to allow only a signal, which goes in a direction from the power level adjuster section to the combiner section, to pass therethrough, and
the second isolator section is configured to allow only a signal, which goes in a direction from the transmission/reception processor section for the second mobile communication system to the combiner section, to pass therethrough.

23. The radio base station apparatus according to claim 22, wherein
the shared amplification function comprises the transmission/reception processor section for the second mobile communication system, the power level adjuster section, the combiner section, and the common amplifier section, for at least two systems.

24. The radio base station apparatus according to claim 1, wherein
the shared amplification function comprises the transmission/reception processor section for the second mobile communication system, the power level adjuster section, the combiner section, and the common amplifier section, for at least two systems.

25. The radio base station apparatus according to claim 24, wherein
the shared amplification function comprises the transmission/reception processor section for the second mobile communication system, the power level adjuster section, the combiner section, and the common amplifier section, for at least two systems.

* * * * *